United States Patent
Xu

(10) Patent No.: US 9,582,374 B2
(45) Date of Patent: *Feb. 28, 2017

(54) MEMORY ARRAY WITH REDUNDANT BITS AND MEMORY ELEMENT VOTING CIRCUITS

(71) Applicant: Altera Corporation, San Jose, CA (US)

(72) Inventor: Yanzhong Xu, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 14/269,863

(22) Filed: May 5, 2014

(65) Prior Publication Data
US 2014/0245113 A1 Aug. 28, 2014

Related U.S. Application Data

(63) Continuation of application No. 12/950,944, filed on Nov. 19, 2010, now Pat. No. 8,739,010.

(51) Int. Cl.
*G06F 11/18* (2006.01)
*G11C 5/00* (2006.01)
*G11C 11/412* (2006.01)

(52) U.S. Cl.
CPC .............. *G06F 11/183* (2013.01); *G11C 5/005* (2013.01); *G11C 11/4125* (2013.01)

(58) Field of Classification Search
CPC ....... G06F 11/18; G06F 11/183; G06F 11/187; G06F 11/188
USPC .................................................. 714/797, 760
See application file for complete search history.

(56) References Cited

U.S. PATENT DOCUMENTS

| 4,454,527 | A | * | 6/1984 | Patalong ........... H01L 29/42308 |
|---|---|---|---|---|
| | | | | 257/138 |
| 4,748,594 | A | | 5/1988 | Idia |
| 5,128,944 | A | | 7/1992 | Flaherty et al. |
| 5,140,594 | A | | 8/1992 | Haulin et al. |

(Continued)

FOREIGN PATENT DOCUMENTS

| CN | 1478282 A | 2/2004 |
|---|---|---|
| CN | 1826661 A | 8/2006 |
| FR | 2764096 B1 | 12/1998 |

OTHER PUBLICATIONS

T. Sugizaki et al, "Low voltage/sub-ns operation bulk thyristor-SRAM (BT-RAM) cell with double selective epitaxy emitters", VLSI 2007, pp. 170-171.

(Continued)

*Primary Examiner* — Loan L. T. Truong
(74) *Attorney, Agent, or Firm* — Treyz Law Group, P.C.; Andrew C. Milhollin

(57) ABSTRACT

An integrated circuit may have an array of memory elements. Each memory element may have multiple memory cells. Each memory element may have a voting circuit that receives signals from the memory cells in that memory element. The voting circuit can produce an output based on the signals. The signals stored by the memory cells of each memory element may be redundant so that the voting circuit can produce an accurate output even in the event that a radiation strike causes some of the memory cells to flip their states to erroneous values. The memory elements may be based on memory cells such as static random-access memory cells and thyristor-based cells.

14 Claims, 12 Drawing Sheets

| A | B | C | F | # OF ERRORS | |
|---|---|---|---|---|---|
| 1 | 1 | 1 | 0 | 0 | } RA |
| 1 | 1 | 0 | 1 | 2 | |
| 1 | 0 | 1 | 1 | 2 | } RD |
| 0 | 1 | 1 | 1 | 2 | |
| 0 | 0 | 1 | 1 | 1 | |
| 0 | 1 | 0 | 1 | 1 | } RC |
| 1 | 0 | 0 | 1 | 1 | |
| 0 | 0 | 0 | 1 | 0 | } RB |

(56) References Cited

U.S. PATENT DOCUMENTS

| | | | | |
|---|---|---|---|---|
| 5,764,533 A * | 6/1998 | deDood | H01L 27/0207 | 257/204 |
| 5,982,199 A | 11/1999 | Yu | | |
| 6,785,169 B1 * | 8/2004 | Nemati | G11C 7/1006 | 365/185.21 |
| 6,804,162 B1 * | 10/2004 | Eldridge | G06F 12/0893 | 365/230.01 |
| 6,937,527 B1 * | 8/2005 | Lotz | H03K 3/0375 | 327/199 |
| 7,078,739 B1 * | 7/2006 | Nemati | G11C 11/39 | 257/107 |
| 7,236,000 B1 * | 6/2007 | Steiner | H03K 19/0033 | 326/10 |
| 7,268,373 B1 * | 9/2007 | Gupta | G11C 11/39 | 257/162 |
| 7,310,759 B1 * | 12/2007 | Carmichael | G06F 11/1004 | 714/725 |
| 7,328,377 B1 * | 2/2008 | Lewis | G06F 11/106 | 714/48 |
| 7,577,012 B2 * | 8/2009 | Murakami | G11C 11/22 | 326/11 |
| 7,620,883 B1 | 11/2009 | Carmichael et al. | | |
| 7,768,317 B1 * | 8/2010 | Dhaoui | G11C 5/005 | 326/113 |
| 7,859,292 B1 | 12/2010 | Shuler | | |
| 7,877,627 B1 * | 1/2011 | Freydel | G06F 11/1633 | 714/11 |
| 7,969,779 B2 * | 6/2011 | Fisch | G11C 7/12 | 365/185.05 |
| 8,069,377 B2 * | 11/2011 | Singh | G01J 3/02 | 714/711 |
| 8,427,199 B2 * | 4/2013 | Katti | H03K 19/168 | 326/104 |
| 8,630,113 B1 | 1/2014 | Xu et al. | | |
| 2004/0015754 A1 * | 1/2004 | Callaway | G11C 29/006 | 714/719 |
| 2007/0016823 A1 * | 1/2007 | Jang | H03K 19/0075 | 714/6.12 |
| 2007/0035988 A1 * | 2/2007 | Matsui | G11C 11/406 | 365/154 |
| 2007/0255981 A1 * | 11/2007 | Eto | G06F 11/1008 | 714/710 |
| 2008/0059869 A1 * | 3/2008 | Brewer | H03M 13/033 | 714/801 |
| 2008/0184065 A1 * | 7/2008 | Thorp | G11C 16/20 | 714/6.12 |
| 2008/0246655 A1 * | 10/2008 | Winkel | H04B 1/707 | 342/357.48 |
| 2009/0080248 A1 * | 3/2009 | Haque | G11C 7/02 | 365/185.03 |
| 2009/0158088 A1 * | 6/2009 | Hillman | G06F 11/1658 | 714/11 |
| 2009/0184733 A1 * | 7/2009 | Lilja | G06F 17/5068 | 326/101 |
| 2010/0146330 A1 * | 6/2010 | Dhong | G06F 11/1048 | 714/6.2 |
| 2010/0250857 A1 * | 9/2010 | Matsui | G06F 12/0859 | 711/133 |
| 2010/0325598 A1 * | 12/2010 | Rezgui | H03K 19/00392 | 716/117 |
| 2011/0108888 A1 * | 5/2011 | Or-Bach | H01L 21/76254 | 257/204 |
| 2012/0012892 A1 * | 1/2012 | Mathew | H01L 29/74 | 257/175 |
| 2012/0131424 A1 * | 5/2012 | Xu | G11O 5/005 | 714/797 |

OTHER PUBLICATIONS

T. Sugizaki, et al, 35-nm gate-Length and ultra low voltage (0.45V) operation Bulk Thyristor SRAM/DRAM (BT-RAM) cell with triple selective epitaxial layers (TELS), VLSI 2008, pp. 198-199.

* cited by examiner

| A | B | C | F | # OF ERRORS |
|---|---|---|---|---|
| 0 | 0 | 0 | 0 | 0 |
| 0 | 0 | 1 | 0 | 1 |
| 0 | 1 | 0 | 0 | 1 |
| 1 | 0 | 0 | 0 | 1 |
| 1 | 1 | 1 | 1 | 0 |
| 1 | 1 | 0 | 1 | 1 |
| 1 | 0 | 1 | 1 | 1 |
| 0 | 1 | 1 | 1 | 1 |

FIG. 8

| A | B | C | F | # OF ERRORS | |
|---|---|---|---|---|---|
| 1 | 1 | 1 | 0 | 0 | } RA |
| 1 | 1 | 0 | 1 | 2 | |
| 1 | 0 | 1 | 1 | 2 | } RD |
| 0 | 1 | 1 | 1 | 2 | |
| 0 | 0 | 1 | 1 | 1 | |
| 0 | 1 | 0 | 1 | 1 | } RC |
| 1 | 0 | 0 | 1 | 1 | |
| 0 | 0 | 0 | 1 | 0 | } RB |

FIG. 10

MEMORY ARRAY WITH REDUNDANT BITS AND MEMORY ELEMENT VOTING CIRCUITS

This application is a continuation of patent application Ser. No. 12/950,944, filed Nov. 19, 2010, which is hereby incorporated by reference herein in its entirety. This application claims the benefit of and claims priority to patent application Ser. No. 12/950,944, filed Nov. 19, 2010.

BACKGROUND

This invention relates to memory elements, and more particularly, to circuitry for ensuring that memory elements exhibit satisfactory immunity to soft error upset events.

Integrated circuits often contain volatile memory elements such as static random-access memory (SRAM) elements. Memory elements can be used to temporarily store data during data processing operations. For example, an integrated circuit that contains processing logic may contain an array of SRAM elements for storing data that is used by the processing logic. Memory elements may also be used in memory chips. Circuits such as field-programmable gate arrays and other programmable devices may contain memory elements that store configuration data for configuring programmable logic.

A volatile memory element retains data only so long as an integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements typically contain transistors that are formed from silicon. When an atomic particle strikes the silicon in a memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the data stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

One way to provide integrated circuits with tolerance to soft error upset events involves periodically checking the status of the bits in a memory array. Using error correction codes such as cyclic redundancy check codes, redundant information may be stored in a section of a memory array. Error checking circuitry can periodically read out the data in a memory array and the corresponding error correction codes to determine whether errors are present in the data. If an error is detected, appropriate action can be taken. For example, in some devices it may be possible to reload a copy of the correct data into the memory array.

The process of periodically reading out the data from a memory array can, however, consume undesired power on an integrated circuit. The circuitry that is used to support these periodic data checks must also be incorporated into the integrated circuit, which can increase circuit cost and complexity. Moreover, there is the possibility that the act of reading out the contents of a memory element will disturb the state of the element, even with properly designed read circuits.

It would therefore be desirable to be able to provide memory circuitry with improved tolerance to soft error upset events.

SUMMARY

An integrated circuit may have an array of memory elements. Each memory element may have multiple redundant memory cells. The memory cells may be based on static random-access memory circuits or thyristor-based circuits.

Each memory element may have a voting circuit that receives signals from the memory cells in that memory element. The voting circuit can produce an output based on the signals. The signals stored by the memory cells of each memory element may nominally be identical so that the voting circuit can produce an accurate output even in the event that a radiation strike causes some of the memory cells to flip their states to erroneous values.

In integrated circuits with memory elements that each have three static random-access memory cells, a voting circuit can correct single cell errors. In integrated circuits with memory elements that are based on three thyristors, the voting circuit can correct single cell errors and double cell errors.

Further features of the invention, its nature and various advantages will be more apparent from the accompanying drawings and the following detailed description of the preferred embodiments.

BRIEF DESCRIPTION OF THE DRAWINGS

FIG. 8 is a table illustrating the behavior of an illustrative voting circuit of the type shown in FIG. 2 that may be used for memory elements containing memory cells of the type shown in FIGS. 3 and 4 in accordance with an embodiment of the present invention.

FIG. 10 is a table illustrating the behavior of an illustrative voting circuit of the type shown in FIG. 2 that may be used for memory elements containing memory cells of the type shown in FIG. 4 to correct single cell errors and double cell errors in accordance with an embodiment of the present invention.

DETAILED DESCRIPTION

This relates to integrated circuits with memory elements. The integrated circuits in which the memory elements are used may be memory chips, digital signal processing circuits with memory arrays, microprocessors, application specific integrated circuits with memory arrays, programmable integrated circuits such as programmable logic device integrated circuits (e.g., field-programmable gate arrays) in which memory elements are used for configuration memory, or any other suitable integrated circuit. For clarity, the memory elements will sometimes be described in the context of programmable integrated circuits. This is, however, merely illustrative.

Figure 1:
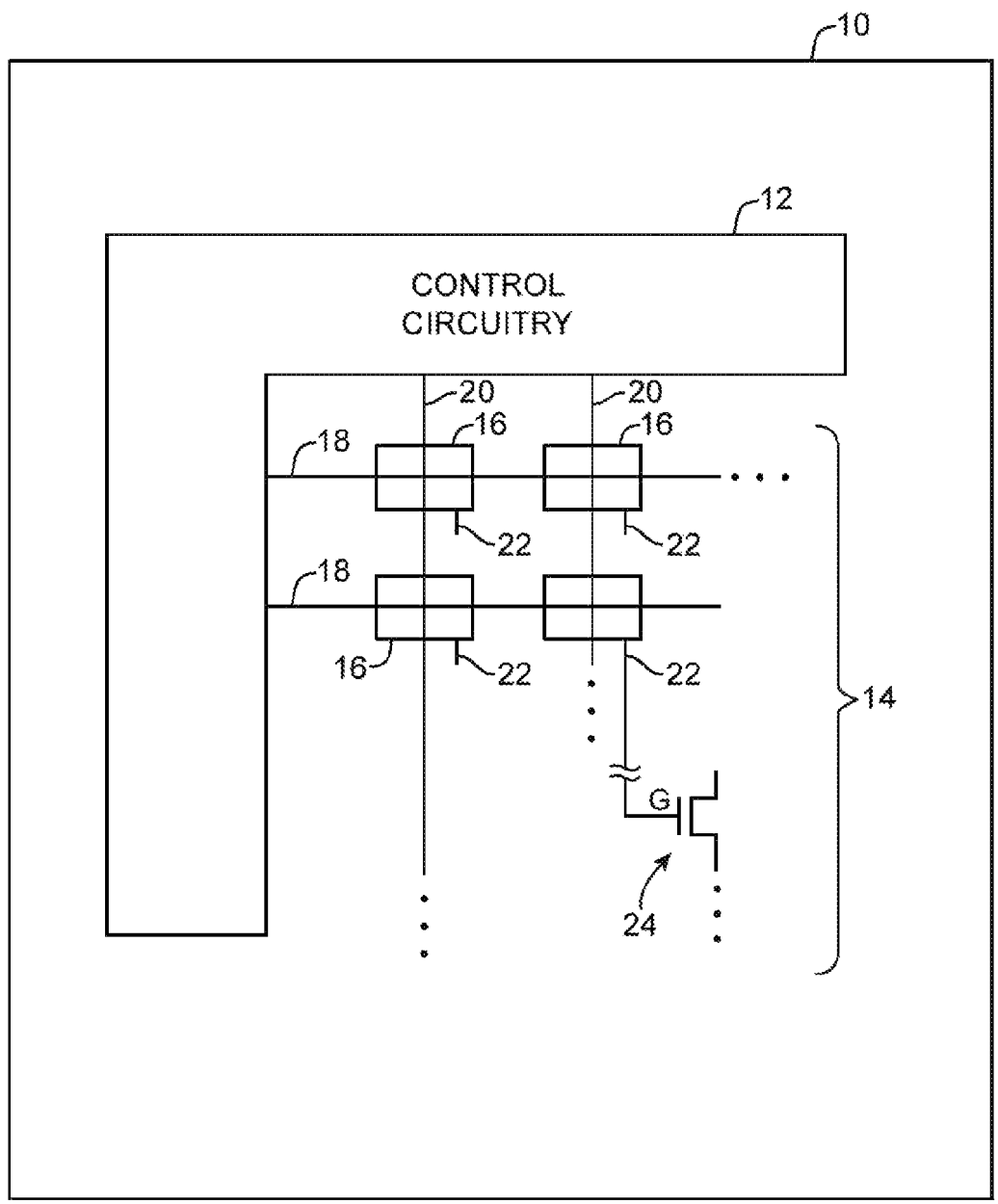
FIG. 1 is a diagram of an illustrative integrated circuit with memory element circuitry in accordance with an embodiment of the present invention.

An illustrative integrated circuit such as a programmable integrated circuit is shown in FIG. 1. As shown in FIG. 1, integrated circuit 10 may include a memory array having read-write control circuitry 12 and an array 14 of memory elements 16. Horizontal and vertical signal paths such as paths 18 and 20 may be used in controlling memory elements 16. In some configurations, for example, paths 18 may include address lines for addressing elements 16 and paths 20 may include bit lines. Bit lines may be used for routing data to elements 16 form control circuitry 12 during write operations and, in configurations that support read operations, may be used for routing data from elements 16 to control circuitry 12.

Paths such as paths 18 may also include other signal paths, such as paths for distributing clear signals (e.g., to control clear transistors), paths for distributing a positive power supply voltage Vcc, paths for distributing a ground power supply voltage Vss, etc. The types of signal lines that are associated with elements 16 and control circuitry 12 depend on the type of memory elements 16 that are used in array 14. In some situations, memory elements 16 may be based on static random-access memory (SRAM) cells. SRAM cells may be based on bistable data storage elements formed from cross-coupled inverters or other circuits. SRAM cells generally allow data to be read and written. In other situations, memory elements 16 may be based on thyristor cells. Thyristor cells can be cleared by depowering the cells. Circuitry 12 may contain control circuits for writing data into thyristor cells and may or may not contain read circuitry for reading data from thyristor cells.

Figure 2:
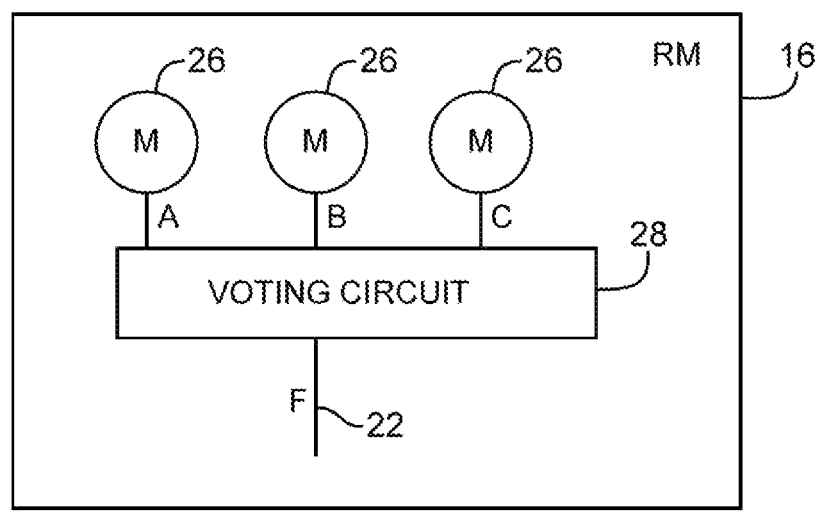
FIG. 2 is a diagram of an illustrative memory element that includes three redundant memory cells and a voting circuit in accordance with an embodiment of the present invention.

FIG. 2 is a circuit diagram of an illustrative memory element. As shown in FIG. 2, memory element 16 may contain a number of individual memory cells 26 (e.g., three or more cells 26). The output of each memory cell 26 may be coupled to a respective input of a voting circuit such as voting circuit 28. The signal outputs from memory cells 26 are labeled "A," "B," and "C" in the FIG. 2 example.

Voting circuit 28 may process the signals from cells 26 and may produce a corresponding output F on path 22. The value of output F is determined from the values of inputs A, B, and C using the voting logic of circuitry 28. For example, in a majority voting scheme, F will have the same logic state as the majority of the A, B, and C signals.

As shown in FIG. 1, each cell 16 in array 14 may have a respective output 22. In a programmable integrated circuit such as a field-programmable gate array or other programmable logic device, memory elements 16 are loaded with configuration data and produce corresponding static output control signals on their outputs 22. The control signals on outputs 22 are applied to programmable logic circuitry on device 10 to customize the programmable logic circuitry to implement a desired logic function. For example, the output signal on each output 22 may be applied to the gate G of a corresponding transistor such as illustrative pass transistor 24 of FIG. 1. Transistor 24 may be, for example, a metal-oxide-semiconductor transistor n-channel metal-oxide-semiconductor transistor or a p-channel metal-oxide-semiconductor transistor that makes up part of a programmable multiplexer or other programmable circuit.

During data loading operations, control circuit 12 of FIG. 1 may load data such as configuration data for a programmable integrated circuit into memory elements 16. When loading each memory element, redundant data may be loaded into each of the three memory cells 26 of each element. For example, the three memory cells 26 in a first memory element may each be loaded with a logic "1" or may each be located with a logic "0". Loading identical data into each of the three cells in a memory element helps make the memory element immune to radiation-induced errors.

During operation of circuit 10, each memory cell 26 may produce a corresponding output. For example, in the three-cell configuration of FIG. 2, a first of the memory cells 26 may produce an output A, a second of the memory cells 26 may produce an output B, and a third of the memory cells 26 may produce an output C. The signals A, B, and C may be analyzed by voting circuit 28, which may produce a corresponding output signal F. If, for example, A, B, and C are all logic ones, voting circuit 28 can conclude that the correct value for the memory bit stored by element 16 is a logic one and can take F to a corresponding value. The value that is used on output F to represent a logic one may be a high voltage (e.g., Vcc value of 1.0 volts) or a low voltage (e.g., a Vss value of 0 volts), depending on the convention used by device 10.

The operation of voting circuit 28 helps ensure that the state of memory element output F does not erroneously flip when device 10 is subjected to a radiation-induced bit error in one of cells 26. Voting circuit 28 may, for example, implement a majority voting scheme in which the output F is equal to the value of the majority of bits A, B, and C. Even if the bit value in one of cells 26 erroneously flips due to a radiation strike, the other two cells in element 16 will still maintain their correct values. In this type of situation, voting circuit 28 will respond by taking the output F to the value held by the majority of the cells. Because two cells hold the correct value and one cell holds an erroneous value in this scenario, the output F will be correct (because two out of three represents a majority).

Majority voting schemes may be used for voting circuit 28 in devices with memory elements 16 that are based on static random-access memory cells (SRAM) cells and/or other cells such as thyristor cells. If no more than one bit error occurs in each memory element, majority-type voting circuits will ensure that the output value F is correct. Double-bit errors (i.e. scenarios in which two of the three cells 26 in a given memory element 16 are erroneously flipped) cannot generally be handled using majority voting.

Double-bit errors can, however, be handled by appropriately configured voting circuits 28 in situations in which cells 26 are based on components such as thyristors that exhibit only one type of data flip in response to radiation strikes. Thyristor-based cells 26 may, for example, only have the potential to erroneously flip from zero to one in response to a radiation strike, not from one to zero. Because of this inherent stability, thyristor-based memory cells 26 may be less prone to errors than SRAM-based memory cells 26.

Figure 3:
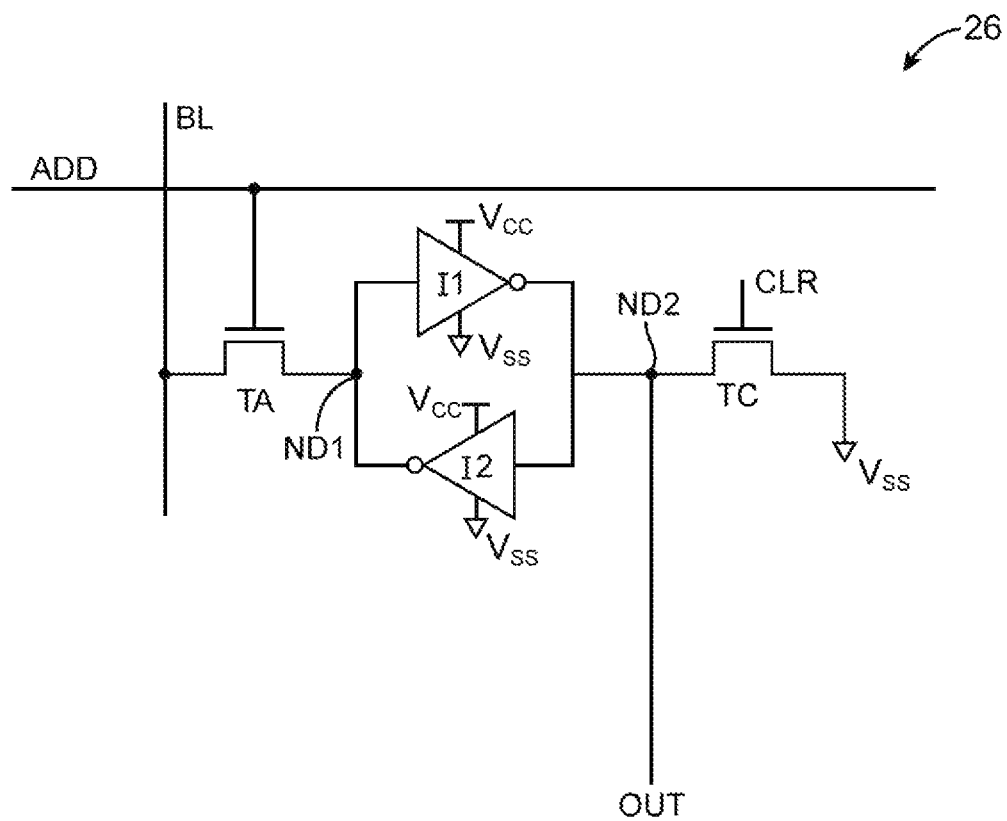
FIG. 3 is a circuit diagram of an illustrative static random-access memory cell that may be used in a memory element of the type shown in FIG. 2 in accordance with an embodiment of the present invention.

An illustrative SRAM-type memory cell that may be used in implementing each of cells 26 of memory element 16 in FIG. 2 is shown in FIG. 3. As shown in FIG. 3, memory cell 26 may be addressed using address line ADD. Address line ADD may be controlled by control circuitry 12. There may be, for example, an address line ADD associated with each row of array 14. Data may be loaded into cell 26 and may be read from cell 26 using bit lines (sometimes referred to as data lines) such as bit line BL.

Data may be stored on data storage nodes ND1 and ND2 by a bistable data storage element such as a bistable data storage element formed form cross-coupled inverters I1 and I2. Inverters I1 and I2 may be powered by positive power supply voltage Vcc and ground power supply voltage Vss. The input of inverter I1 in the FIG. 3 example is connected to node ND1 and the output of inverter I1 is connected to node ND2. The input of inverter I2 is connected to node ND2 and the output of inverter I2 is connected to node ND1. The bit values on nodes ND1 and ND2 are therefore complementary. When a logic one has been loaded into cell 26, ND2 will be high and ND1 will be low. When a logic zero is being stored in cell 26, ND2 will be low and ND1 will be high.

The value of the bit on node ND2 may be applied to output line OUT (e.g. to provide one of the A, B, or C signals of FIG. 2). If desired, multiple cells 26 may be cleared by asserting clear control signal CLR for each of the multiple cells. In each cell that receives a high CLR control signal, clear transistor TC will be turned on. When transistor TC in a given cell is turned on, node ND2 and output OUT in that cell will be pulled low to ground voltage Vss (e.g., 0 volts).

When it is desired to load a logic one into cell 26, bit line BL may be held low (e.g., at Vss) and address signal ADD may be asserted by taking ADD high. When ADD is taken high, address transistor TA will be turned on, driving the low signal on bit line BL into node ND1. When ND1 is pulled low in this way, node ND2 will go high (i.e., cell 26 will store a logic one). When it is desired to load a logic zero into cell 26, bit line BL may be maintained a high value (e.g. Vcc). With bit line BL high, address signal ADD may be asserted to turn on address transistor TA. This will drive the high signal from bit line BL onto node ND1. When node ND1 goes high, inverter I1 will drive ND2 low, thereby completing the operation of loading a zero into cell 26. Read operations may be performed by asserting ADD while monitoring the status of bit line BL.

Figure 4:
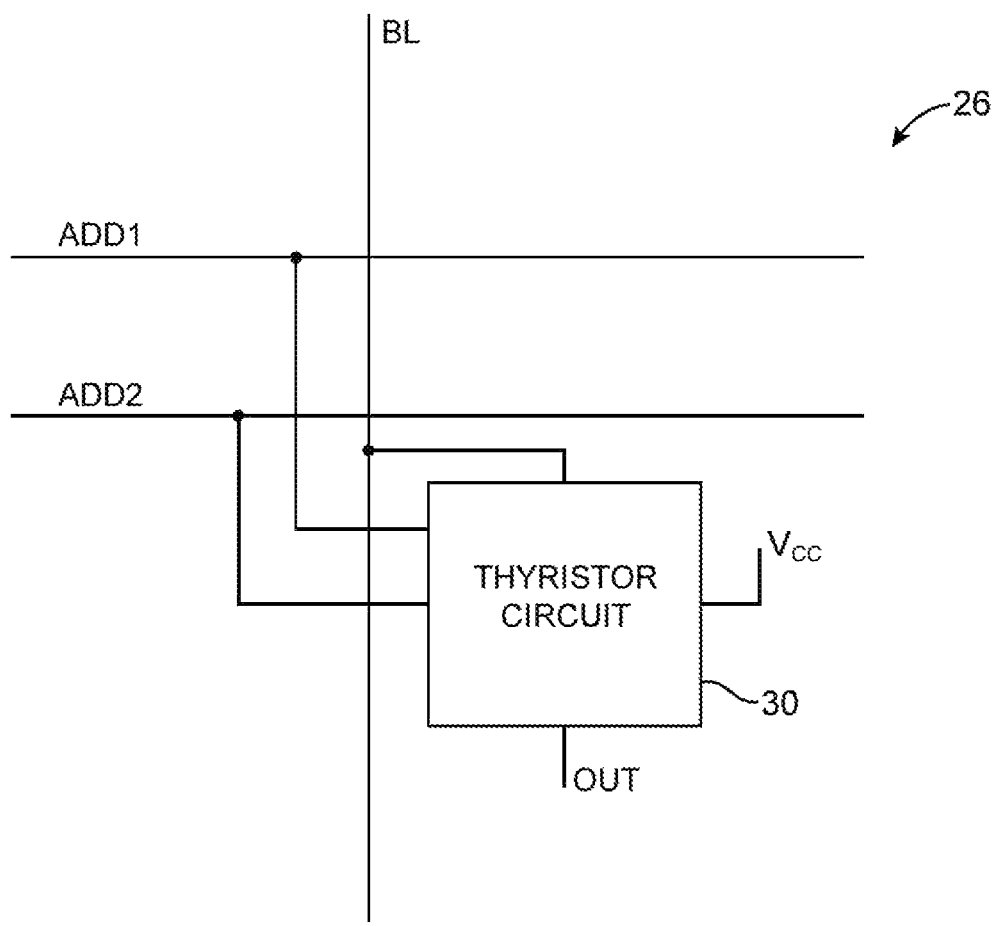
FIG. 4 is a circuit diagram of a thyristor memory cell that may be used in a memory element of the type shown in FIG. 2 in accordance with an embodiment of the present invention.

An illustrative thyristor-based memory cell of the type that may be used for cells 26 of FIG. 2 is shown in FIG. 4. As shown in FIG. 4, thyristor-based cell 26 may store data using a bistable data storage element formed from thyristor circuit 30. Cell 26 may have associated control lines such as address lines ADD1 and ADD2. Signals ADD1 and ADD2 may be asserted to read data from thyristor circuit 30 onto bit line BL and to write data into thyristor circuit 30. Control signals for controlling memory cells such as memory cell 26 of FIG. 4 may be generated by control circuitry 12 and may be conveyed over vertical and horizontal control lines such as lines 18 and 20 in FIG. 1.

Power supply voltage Vcc may be held high (e.g., at 1.0 volts or other suitable voltage) during normal operation, when it is desired to retain loaded data on thyristor circuit 30. When it is desired to clear thyristor circuit 30, Vcc may be depowered (e.g., taken momentarily to a Vss value of 0 volts).

Figure 5:
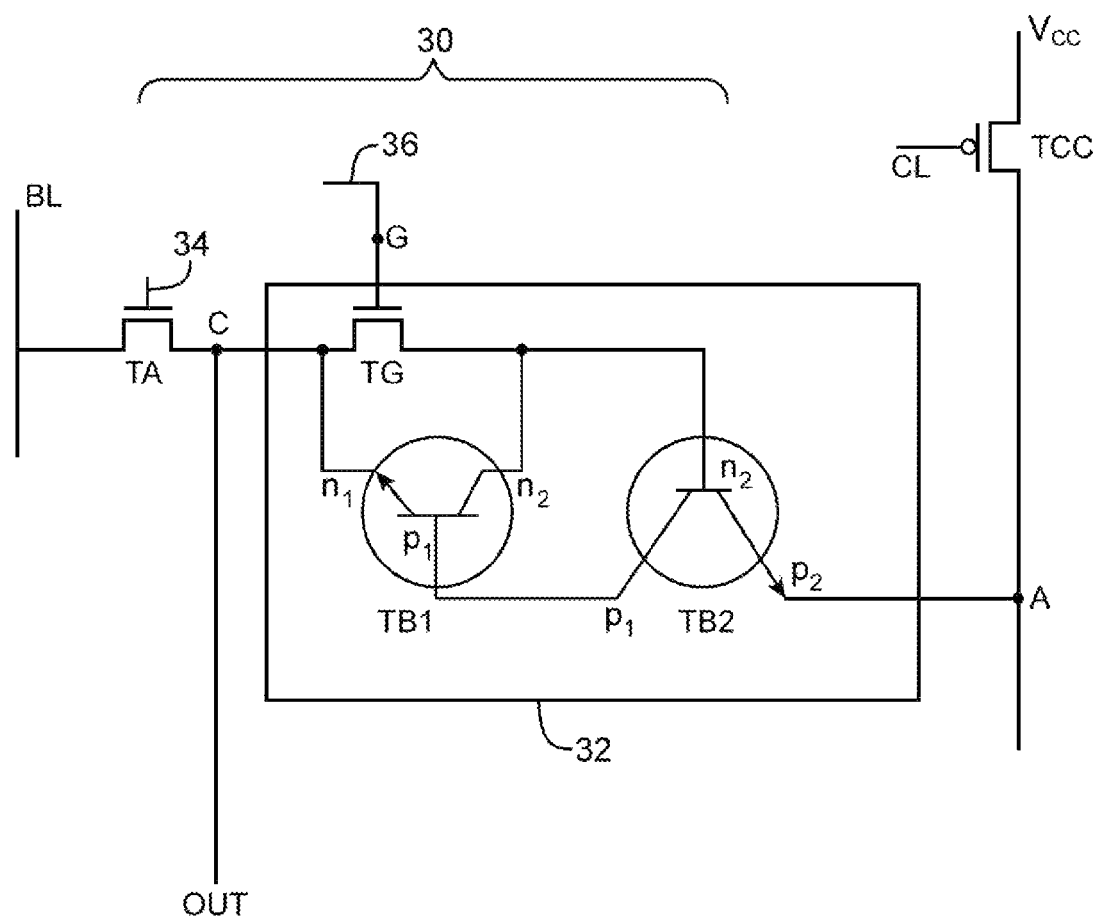
FIG. 5 shows circuitry that may be used in a thyristor memory cell of the type shown in FIG. 4 in accordance with an embodiment of the present invention.

FIG. 5 shows how thyristor circuit 30 may include thyristor 32 and transistor TA. Transistor TA may receive control signals via gate 34. Thyristor 32 may be formed from a p-n-p-n structure with a control gate G (illustrated as the gate of transistor TG). As shown in FIG. 5, thyristor 32 effectively includes a first bipolar transistor portion TB1, a second bipolar transistor portion TB2, and control transistor portion TG. Gate G may be controlled by a control signal on line 36.

Figure 6:
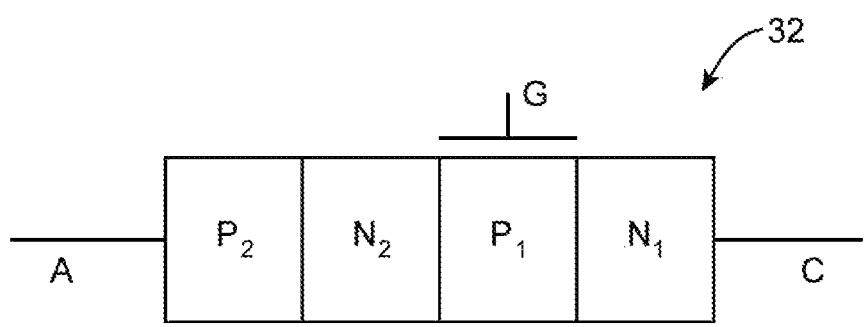
FIG. 6 is a diagram showing p-type and n-type doped semiconductor regions that may be used in a thyristor for a thyristor-based memory cell in accordance with an embodiment of the present invention.

A diagram showing the doped regions in thyristor 34 is shown in FIG. 6. As shown in FIG. 6, thyristor 34 may have an anode A and a cathode C. The signal stored on cathode C may represent the stored data in thyristor-based cell 26.

When it is desired to write a logic one onto data storage node C, the signal on line 36 may be asserted (e.g., taken high). As shown in FIG. 5, transistor TB1 may have a terminal that forms thyristor cathode C. Transistor TB2 may have a terminal that forms thyristor anode A. Anode A may be powered by voltage Vcc. To power thyristor 32 and thereby allow thyristor 32 to store data OUT on cathode C, transistor TCC may be turned on by holding control signal CL low (signal CL and transistor TCC may be shared by multiple thyristors 32). When it is desired to depower thyristor 32 and thereby clear its contents (i.e., when it is desired to take the stored bit on output OUT to Vss), transistor TCC may be turned off by taking control terminal CL high. When transistor TCC is turned off, node A will drop to a low voltage (e.g., Vss) and the state of thyristor 32 will revert to its initial "unprogrammed" state (i.e., the voltage on C will be low). The state of thyristor circuit (i.e., the voltage on cathode C of thyristor 32) may be sensed by taking the signal on control gate 34 high. This turns on transistors TA so the voltage on node C can be sensed via bit line BL.

Figure 7:
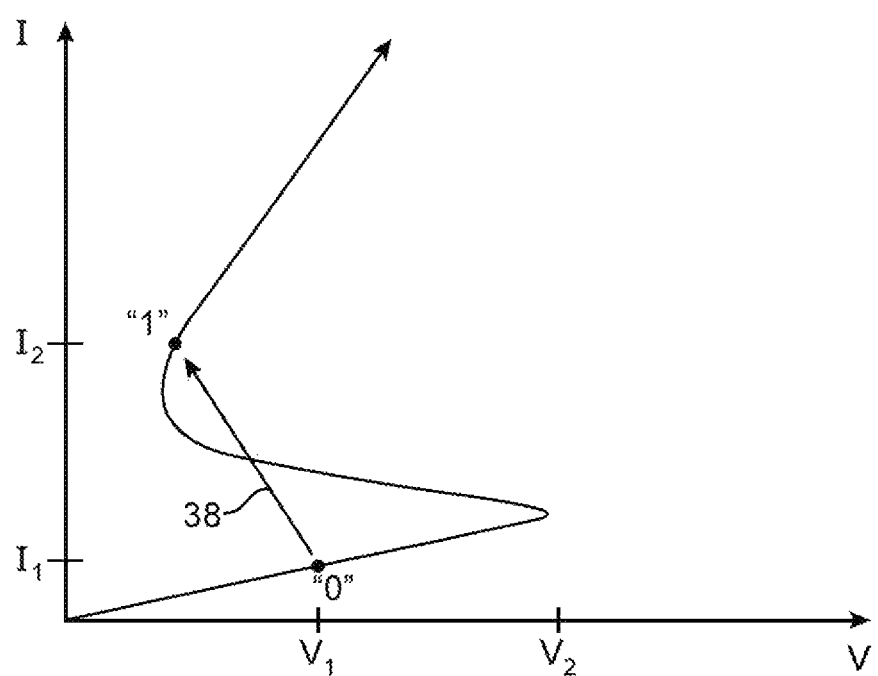
FIG. 7 is a graph of a current versus voltage characteristic associated with a thyristor for a thyristor memory cell in accordance with an embodiment of the present invention.

The I-V characteristic of FIG. 7 shows how thyristor 32 may be used to store data. Initially, thyristor 32 may be in an unpowered state. When a voltage V1 is applied to the anode A of thyristor 32 to power thyristor 32 (e.g., via the Vcc terminal of FIG. 5), thyristor 32 will pass a current I1 between its anode and its cathode and will exhibit a low voltage at cathode C. In this state, thyristor 32 may be considered to be storing a logic "0." The state of the thyristor (i.e., the "0" on cathode C, which may serve as output signal OUT) can be maintained by maintaining the voltage on the thyristor at a value that is less than threshold voltage V2.

When it is desired to program thyristor 32, a positive voltage pulse (e.g., a pulse of about 1 volt as an example) may be applied to gate G. This causes the thyristor to transition to operation in the "1" position of FIG. 7, as illustrated by line 38. In the "1" position, thyristor 32 will pass current I2 and will exhibit a higher voltage (indicative of a logic "1" on cathode C). Although the state of thyristor 32 when operating in the "0" state can be erroneously flipped to the "1" state by a radiation strike, radiation strikes on thyristor 32 when operating the "1" state will not result in a "1" to "0" flip. Rather, radiation strikes on thyristor 32 when thyristor 32 is storing a "1" will leave the state of thyristor 32 unchanged. Thyristor 32 is therefore subject to erroneous flips in state in only one direction (i.e., low to high but not high to low). In contrast, SRAM cells such as illustrative SRAM cell 26 of FIG. 3 are generally subject to flips in both the low to high and the high to low directions when struck by radiation.

Voting circuit 28 of FIG. 2 may be tailored to the type of redundant memory cell that is being used in memory element 16. When a memory element that is subject to both low-to-high and high-to-low flips in the event of a radiation strike, a majority voting scheme may be implemented. Thyristor-based memory elements may also use majority voting (if desired). When majority voting logic is used in voting circuit 28, memory elements 16 can survive single-error upset events (the erroneous flip of one of the three memory cells 26 in a given element).

When a memory element is only subject to one-way flips, as with a memory element that is formed from three thyristor memory cells, the voting circuit may, if desired, use logic that allows two of the cells to flip from low to high without leading to an erroneous flip in the memory element output. The reverse situation (handling flips in the memory cells between high and low) does not need to be considered, because this type of upset event does not result from radiation strikes to thyristor cells. Memory elements 16 that are based on three thyristor cells are therefore able to handle both single-cell upsets and dual-cell upsets.

FIG. 8 is a table showing how voting circuit 28 of FIG. 2 may operate when implementing a majority voting scheme of the type appropriate for use with memory cells 26 that are formed from SRAM-based memory cells (or, if desired, thyristor-based memory cells). The first three columns of the table of FIG. 8 correspond to the three memory cells of FIG. 2. In particular, the memory cell that produces the output A in FIG. 2 corresponds to the first column of the table of FIG. 8, the memory cell that produces the output B in FIG. 2 corresponds to the second column of the table of FIG. 8, and the memory cell that produces the output C in FIG. 2 corresponds to the third column of the table of FIG. 8. During operation, voting circuitry 28 (FIG. 2) receives the respective A, B, and C outputs from memory cells 26 as inputs and produces a corresponding output F on output path 22. The fourth column of the table of FIG. 8 shows the values of F that are produced for various combinations of A, B, and C at the input of voting circuit 28.

The voting circuit operations of FIG. 8 can correct up to one memory cell error per memory element. The number of memory cell errors that are being corrected by the voting circuit are listed in the fifth column of the table of FIG. 8. When all cells 26 contain the same information, no errors are present and the output F will be equal to the contents of each of cells 26. For example, when A, B, and C are equal to "0," the output F will be "0," as shown in the first row of the table of FIG. 8. As shown in the fifth row of the FIG. 8 table, the output F will be "1" when the contents of the A, B, and C cells are all "1."

In some situations, radiation strikes may cause a cell to flip. For example, a radiation strike to an SRAM cell or a thyristor cell may cause a "0" to flip to a "1" or a radiation strike to an SRAM cell that contains a "1" may cause the SRAM cell to flip to a "0." Both high-to-low and low-to-high cell flips can be handled by the voting circuit response of FIG. 8. For example, an erroneous flip of a "0" to a "1" (illustrated by the entries in the second, third, and fourth rows of FIG. 8) will not cause the output F to erroneously change. So long as two of the three memory cells 26 supply zeros at their outputs, the final output F of the memory cell will remain at "0."

Both high-to-low and low-to-high cell flips can be handled by the voting circuit response of FIG. 8. For example, an erroneous flip of a "0" to a "1" (illustrated by the entries in the second, third, and fourth rows of FIG. 8) will not cause the output F to erroneously change. So long as two of the three memory cells 26 supply zeros at their outputs, the final output F of the memory cell will remain at "0." An erroneous flip of a "1" to a "0," which may occur in SRAM based cells, but not thyristor-based cells and which is illustrated by the entries in the sixth, seventh, and eighth rows of FIG. 8, will also not cause the output F to erroneously change. So long as two of the three memory cells 26 correctly supply ones at their outputs, the final output F of the memory cell will remain at "1."

Figure 9:
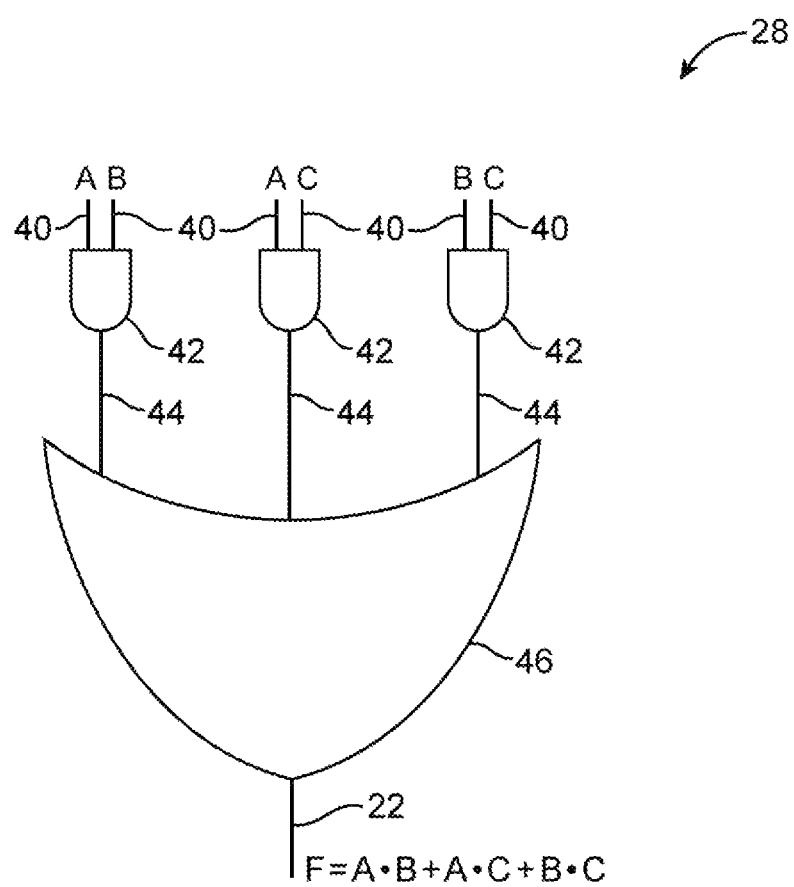
FIG. 9 is a circuit diagram of an illustrative voting circuit that may be used to implement the voting behavior of FIG. 8 in accordance with an embodiment of the present invention.

The voting operation of the table of FIG. 8 may be implemented using voting circuitry of the type shown in FIG. 9 (as an example). As shown in FIG. 9, logic signals A, B, and C may be provided to inputs 40 of AND gates 42. Each AND gate 42 may be, for example, a two-input AND gate that forms an output that is a logical AND function of its two inputs at a respective output path 44. For example, the leftmost AND gate 42 in the example of FIG. 9 forms an output signal on its output path 44 that is equal to A AND B (i.e., A·B). Logic gate 46 receives the signals on lines 44 as inputs and produces a corresponding output F on output path 22. Gate 46 may be a logic gate such as an OR gate. If desired, a NOR gate may be used instead of an OR gate (i.e., if convention calls for the F to be a logic one when all memory cells 26 are zeros).

When implemented using an OR function, gate 46 will produce an output F that is the logical OR (+) of its inputs. The value of F with the circuit of FIG. 9 is therefore given by equation (1).

$$F = A \cdot B + A \cdot C + B \cdot C \quad (1)$$

As indicated by equation 1, the output F will be high whenever any two inputs are high and the output F will be low in response to a collection of inputs that contain at least two low values (i.e., the circuit of FIG. 9 implements majority voting, as described in connection with FIG. 8). If desired, more cells may be included in memory element 16 (e.g., five) and a five-input voting circuit of the type shown in FIG. 9 may be used. Three-cell schemes are, however, generally more able to use circuit real estate efficiently and help reduce the complexity of device 10.

As described in connection with FIGS. 4, 5, 6, and 7, thyristor-based memory cells are generally only susceptible to low-to-high radiation-induced errors (when using a logic level naming convention of the type described in connection with FIG. 7) and are not susceptible to high-to-low radiation-induced errors. This property can be exploited to allow voting circuit 28 to accommodate both single-cell flips and double-cell flips.

A table showing how voting circuit 28 may operate when implementing a voting scheme of the type appropriate for use with memory cells 26 that are formed from thyristor-based memory cells is shown in FIG. 10. As with the table of FIG. 8, the first three columns of the table of FIG. 10 correspond to the three memory cells of FIG. 2 (in this case, thyristor-based cells). The thyristor-based memory cell that produces the output A in FIG. 2 corresponds to the first column of the table of FIG. 10, the thyristor-based memory cell that produces the output B in FIG. 2 corresponds to the second column of the table of FIG. 10, and the thyristor-based memory cell that produces the output C in FIG. 2 corresponds to the third column of the table of FIG. 10. During operation, voting circuitry 28 (FIG. 2) receives the respective A, B, and C outputs from memory cells 26 as inputs and produces a corresponding output F on output path 22 in accordance with the entries of the table of FIG. 10. The fourth column of the table of FIG. 10 shows the values of F that are produced for various combinations of A, B, and C at the input of voting circuit 28. The fifth column shows how many errors are present in the A, B, and C values.

As shown in the row RA, the output F will be "0" when A, B, and C are all "1." The value of F is inverted with respect to the value of redundant bits of memory cells 26 in this example. If desired, the value of F may be non-inverted. In the situation represented by row RA, the bit stored in each of the A, B, and C cells is identical and is high. Row RB represents the situation in which the bit stored in each of the A, B, and C cells is identical and is low. The row RA and RB scenarios correspond to situations in which no errors are contained in the memory cells 26.

Due to a radiation strike, cells 26 that contain a "0" may erroneously flip to a "1" state. In the scenarios of rows RC, one of the three cells has erroneously flipped from a "0" to a "1," but, as shown by the corresponding F values for these rows, the output F is unchanged (i.e., F is still equal to "1" even in the presence of a single memory cell error). In the scenarios of rows RD, two of the three cells have erroneously flipped from a "0" to a "1." Even through two cells have flipped, the output F is again unchanged (i.e., F is still equal to a "1" even in the presence of a double memory cell error). If all three cells in the memory element erroneously flip (i.e., all three "0s" flip to "1s," the value of F (i.e., the output of the memory element) will not be correct. The likelihood of such a triple cell error occurring is, however, negligible.

Figure 11:
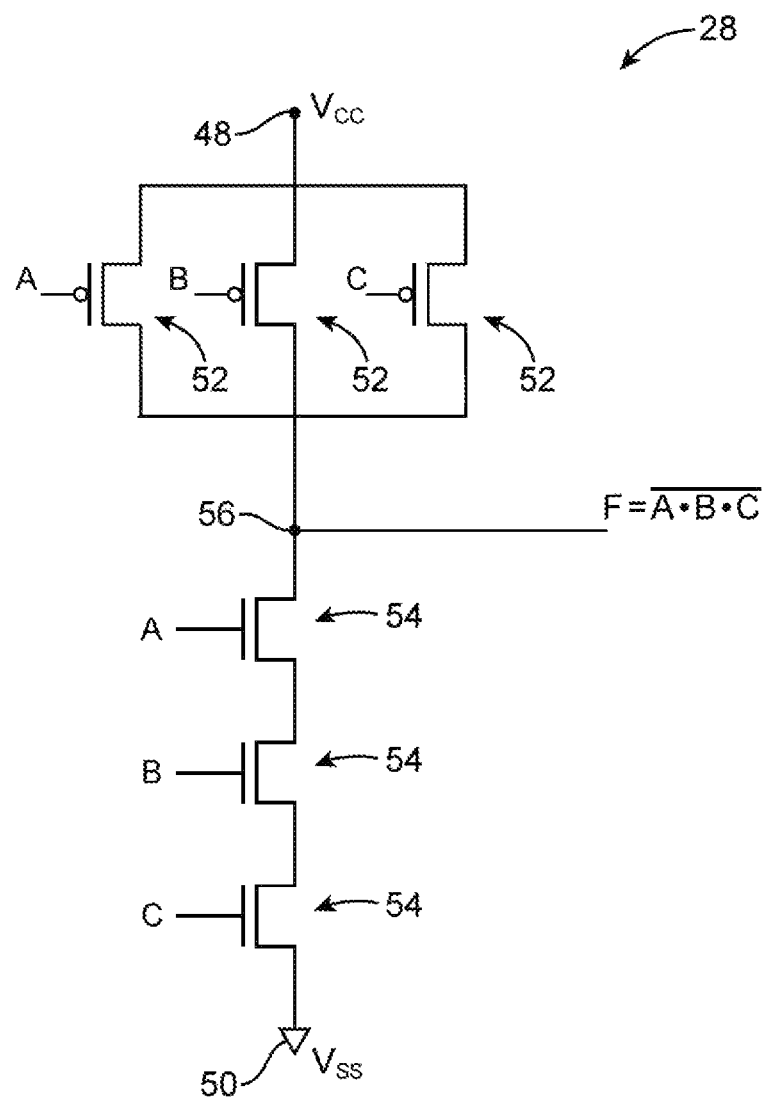
FIG. 11 is a circuit diagram of an illustrative voting circuit that may be used to implement the voting behavior of FIG. 10 in accordance with an embodiment of the present invention.

Illustrative circuitry that may be used for voting circuit 28 to implement the logic functions of FIG. 10 are shown in FIG. 11. As shown in FIG. 11, voting circuit 28 may have three p-channel metal-oxide semiconductor (PMOS) transistors 52 and three n-channel metal-oxide-semiconductor (NMOS) transistors 54. Transistors 52 may be configured so that their source-drain terminals are connected in parallel between terminal 48 and node 56. Transistors 54 may be configured so that their source-drain terminals are connected to each other in series between node 56 and terminal 50. Terminal 48 may be used to supply voting circuit 28 with a positive power supply voltage Vcc. Terminal 50 may be used to supply voting circuit 28 with a ground power supply voltage Vss (e.g., 0 volts).

Each of PMOS transistors 52 may have a gate that receives a respective memory cell output (i.e., A, B, or C, respectively). Each of NMOS transistors 54 may have a gate that receives A, B, or C, respectively. Output F may be provided on node 56. With the circuitry of FIG. 11, output F on node 56 will produce a signal in response to inputs A, B, and C in accordance with equation 2.

$$F = NOT(A \cdot B \cdot C) \qquad (2)$$

The voting circuit operation represented by equation 2 corresponds to the entries of the table of FIG. 10 and is suitable for correcting one-cell and two-cell errors, as described in connection with the use of memory elements that each include three thyristor-based memory cells.

Figure 12:
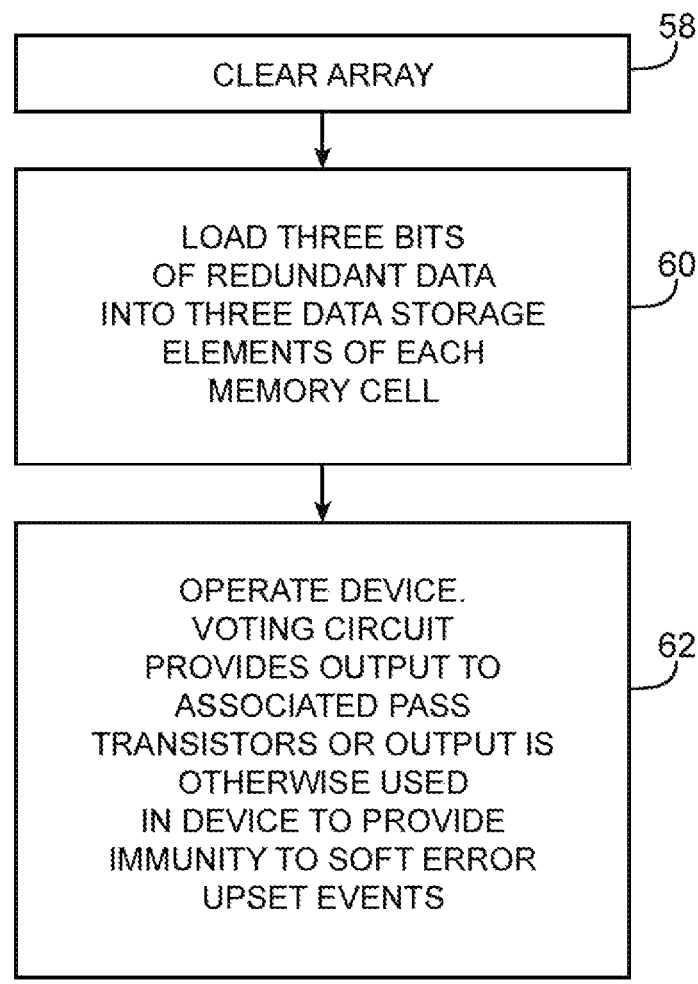
FIG. 12 is a flow chart of illustrative steps involved in operating an integrated circuit with memory elements such as the integrated circuit of FIG. 1 in accordance with an embodiment of the present invention.

Illustrative steps involved in operating circuit 10 of FIG. 1 using memory elements 16 with voting circuits are shown in FIG. 12. The voting circuits used in the operations of FIG. 12 may be, for example, voting circuits 28 in memory elements 16 with thyristor-based memory cells 26 and the ability to recover from both single errors and double errors, as described in connection with FIGS. 10 and 11 (as an example).

At step 58, array 14 may be cleared. For example, transistors such as transistor TCC of FIG. 5 may be turned off by taking clear control signal CL high, thereby blocking the application of positive power supply voltage Vcc to thyristor 32. With Vcc removed from thyristor 32 in this way, thyristor 32 will become cleared and, when repowered, will operate in the "0" state shown in FIG. 7.

At step 60, control circuitry 12 can issue control signals on control lines such as control lines 18 and 20 that load desired data into memory elements 16. As described in connection with FIGS. 5 and 7, for example, gates G may be selectively pulsed to transition memory cells 26 from their "0" to their "1" states. In memory elements in which the memory cell gates G are not pulsed, the contents of the memory cells will remain as "0."

To ensure immunity to soft error upset events, all three cells 26 in each memory element may be treated in the same way. For example, if it is desired to cause the output F of a given memory element to be "0," all three memory cells 26 in that memory element may be placed in their "1" state, whereas if it is desired to cause the output F of the memory element to be "1," all three memory cells 26 in that memory element may be placed in their "0" state. (In non-inverting schemes, three "1s" are loaded into the cells of an element that is to produce a "1" and three "0s" are located into the cells of an element that is to produce a "0.")

After memory elements in array 14 have been loaded with redundant data, circuit 10 may be used in a system (step 62). During the operations of step 62, radiation strikes may erroneously cause some of the cells 26 in circuit 10 to flip. When thyristor-based cells are used, flips only occur in one direction (e.g., from "0" to "1"), so a voting circuit of the type described in connection with FIG. 11 may be used that is capable of handling both single error and double error scenarios. The output F of the voting circuit 28 may be applied to programmable logic circuitry in circuit 10. For example, each output F may be applied to a corresponding gate of a programmable transistor such as illustrative transistor 24 of FIG. 1, thereby configuring the programmable transistors and the programmable logic that contains the programmable transistors to perform a desired logic function.

The foregoing is merely illustrative of the principles of this invention and various modifications can be made by those skilled in the art without departing from the scope and spirit of the invention.

What is claimed is:
1. A method, comprising:
  with a plurality of thyristor-based memory cells in a memory element, storing redundant data; and
  with a voting circuit in the memory element, receiving signals from the thyristor-based memory cells and producing a corresponding output for the memory element, wherein the corresponding output is correct even when the thyristor-based memory cells contain only one correct bit and two erroneously flipped bits.

2. The method defined in claim 1 wherein, with the voting circuit in the memory element, receiving signals from the thyristor-based memory cells and producing the corresponding output for the memory element comprises:
with the voting circuit, producing a logic one output when the thyristor-based memory cells store logic zeros.

3. The method defined in claim 1 wherein, with the voting circuit in the memory element, receiving signals from the thyristor-based memory cells and producing the corresponding output for the memory element comprises:
with gate terminals of first, second, and third transistors in the voting circuit, receiving signals from first, second, and third thyristor-based memory cells in the plurality of thyristor-based memory cells, wherein the first, second, and third transistors are coupled in parallel between a first terminal and an output node; and
with gate terminals of fourth, fifth, and sixth in the voting circuit, receiving signals from the first, second, and third thyristor-based memory cells in the plurality of thyristor-based memory cells, wherein the fourth, fifth, and sixth transistors are coupled in series between the output node and a second terminal.

4. The method defined in claim 1 wherein at least one of the thyristor-based memory cells comprises a thyristor that has an anode that receives a positive power supply voltage and that has a cathode, wherein the voting circuit is coupled to the cathode.

5. The method defined in claim 1 wherein each of the thyristor-based memory cells comprises a respective thyristor that has an anode that receives a positive power supply voltage and that has a cathode, wherein the cathodes supply the signals to the voting circuit.

6. A method, comprising:
with each of three memory cells in a memory element, storing a respective bit of data; and
with a voting circuit that is coupled to the three memory cells, producing an output in response to the bits of data in the three memory cells, wherein a first of the three memory cells contains a correct bit, wherein a second and third of the three memory cells contain erroneously flipped bits, wherein the voting circuit produces a correct version of the output in response to receiving the correct bit and the erroneously flipped bits from the memory cells, and wherein the three memory cells are susceptible to erroneous bit flips in one direction.

7. The method defined in claim 6 wherein each memory cell includes a thyristor.

8. The method defined in claim 7 wherein the thyristors comprises anodes and cathodes, wherein the anodes receive a positive power supply voltage, and wherein the cathodes provide the bits of data to the voting circuit.

9. The method defined in claim 6 wherein the voting circuit comprises at least three parallel transistors each of which has a gate coupled to a respective one of the memory cells.

10. The method defined in claim 6 wherein the voting circuit comprises at least three transistors coupled in series each of which has a gate coupled to a respective one of the three memory cells.

11. A method, comprising:
with at least one memory element having three thyristor-based memory cells and a voting circuit coupled to the thyristor-based memory cells, producing an output using a NAND gate in the voting circuit, wherein the NAND gate receives three respective stored data bits from the thyristor-based memory cells, and wherein the output is correct when the thyristor-based memory cells contain only one correct bit and two erroneously flipped bits; and
with a gate of at least one programmable transistor, receiving the output from the memory element.

12. The method defined in claim 11 wherein the at least one memory element comprises one of a plurality of memory elements each of which has three thyristor-based memory cells that store three respective data bits and each of which has a voting circuit coupled to the three thyristor-based memory cells of that memory element, wherein the voting circuit of each memory element includes a NAND gate that produces a corresponding output based on the data bits stored in the three thyristor-based memory cells of that memory element, and wherein the programmable transistor comprises one of a plurality of programmable transistors each having a respective gate coupled to the output of a respective one of the plurality of memory elements.

13. The method defined in claim 12 wherein each thyristor-based memory cell has a thyristor with an anode that receives a positive power supply voltage and a cathode on which the data bit for that thyristor-based memory cell is stored.

14. The method defined in claim 13 wherein the voting circuits each have three transistors coupled in parallel.

* * * * *